US006954919B2

(12) United States Patent
Ozaki et al.

(10) Patent No.: US 6,954,919 B2
(45) Date of Patent: Oct. 11, 2005

(54) SEMICONDUCTOR INTEGRATED CIRCUIT CAPABLE OF FACILITATING LAYOUT MODIFICATION

(75) Inventors: Masaru Ozaki, Tokyo (JP); Hideo Matsui, Tokyo (JP)

(73) Assignee: Renesas Technology Corporation, Tokyo (JP)

( * ) Notice: Subject to any disclaimer, the term of this patent is extended or adjusted under 35 U.S.C. 154(b) by 137 days.

(21) Appl. No.: 10/606,830

(22) Filed: Jun. 27, 2003

(65) Prior Publication Data

US 2004/0088667 A1 May 6, 2004

(30) Foreign Application Priority Data

Oct. 31, 2002 (JP) ........................................ 2002-318326

(51) Int. Cl.[7] .............................................. G06F 17/50
(52) U.S. Cl. .............................................. 716/11; 716/8
(58) Field of Search .............................. 716/1–2, 7–13

(56) References Cited

U.S. PATENT DOCUMENTS 5,883,814 A * 3/1999 Luk et al. ...................... 716/2

FOREIGN PATENT DOCUMENTS

| JP | 61-190969 | 8/1986 |
| JP | 2001-257266 | 9/2001 |

* cited by examiner

Primary Examiner—Vuthe Siek
Assistant Examiner—Paul Dinh
(74) Attorney, Agent, or Firm—Burns, Doane, Swecker & Mathis, LLP

(57) ABSTRACT

A semiconductor integrated circuit includes a variable region to be subjected to a layout modification in conjunction with a change of a circuit component within the variable region; and a fixed region that is free from the layout modification, and includes a circuit such as a CPU core and peripheral functional section whose signal transfer characteristics are known when the circuit is considered as a closed circuit. It can reduce the manpower required for the layout modification and characteristic verification and evaluation of the circuit involved in the layout modification.

6 Claims, 5 Drawing Sheets

SEMICONDUCTOR INTEGRATED CIRCUIT CAPABLE OF FACILITATING LAYOUT MODIFICATION

BACKGROUND OF THE INVENTION

1. Field of the Invention

The present invention relates to a semiconductor integrated circuit capable of facilitating layout modification involved in changes of circuit components of the semiconductor integrated circuit.

2. Description of Related Art

Conventionally, as for the chip layout of a semiconductor integrated circuit such as a microcomputer, ASIC (Application Specific Integrated Circuit) and the like, a matter of highest priority is to minimize the chip cost by reducing the chip area as much as possible. More specifically, the layout (floor plan) of integrated circuits constituting chips and sub-modules such as pad cells is usually optimized from the view point of minimizing the chip area under conditions that the timing constraints of interface signals are satisfied. Here, the integrated circuits constituting chips are such as a CPU, ROM, RAM, timer, and UART (Universal Asynchronous Receiver Transmitter).

In addition, as for one-chip microcomputers with a built-in ROM and RAM, a plurality of serialized products are often developed by varying the size of the ROM and RAM or by making variations in peripheral circuits. In such one-chip microcomputers, the layout is also carried out in terms of minimizing the chip area.

In the foregoing layout modification of the semiconductor integrated circuit considering only minimizing the chip area, the layout of the entire circuit must be changed every time the function or performance of the circuit components varies. This presents a problem of requiring a lot of labor for making the layout modification involved in the changes of the circuit components.

To solve the problem, a technique is provided that separates the entire circuit into two section, a rather fixed section whose functions are seldom modified, and a rather extendable, modifiable section whose functions are easily added or modified, and that places the two sections separately in the vertical or horizontal direction (see, relevant reference 1).

[Relevant Reference 1]

Japanese patent application laid-open No. 61-190969

To change the circuit components of the semiconductor integrated circuit, the conventional method has a problem in that it must modify the entire layout in such a manner that the chip area becomes minimum, and that it must carry out the characteristic evaluation of the entire circuit once more. Accordingly, it requires much development manpower for the chip layout design and the verification and evaluation of the characteristics involved in the modification of the circuit components.

On the other hand, the technique disclosed in the relevant reference 1 carries out the layout design of the rather fixed section and that of the extendable, modifiable section separately without considering the verification and evaluation of the circuit characteristics. Consequently, it is likely that the characteristic verification and evaluation of the entire circuit after the layout modification must be made once again, which can present a problem of being unable to reduce the manpower required for the modification of the circuit components.

SUMMARY OF THE INVENTION

The present invention is implemented to solve the foregoing problems. It is therefore an object of the present invention to provide a semiconductor integrated circuit capable of reducing the manpower required for the layout modification and the verification and evaluation of the circuit characteristics involved in the layout modification.

According to an aspect of the present invention, there is provided a semiconductor integrated circuit including: a variable region to be subjected to a layout modification in conjunction with a change of a circuit component within the variable region; and a fixed region that is free from the layout modification, and includes a circuit whose signal transfer characteristics are known when the circuit is considered as a closed circuit. Thus, it can circumvent not only the layout design and layout verification of the fixed section, but also the timing verification of the signal transfer of the circuit disposed in the fixed section. Accordingly, it offers an advantage of being able to reduce the manpower required for the layout modification and characteristic verification and evaluation of the circuit involved in the modification. Furthermore, it offers an advantage of being able to obviate the characteristic evaluation of the fixed section in the characteristic evaluation of the entire semiconductor integrated circuit after manufacturing.

DETAILED DESCRIPTION OF THE PREFERRED EMBODIMENTS

The invention will now be described with reference to the accompanying drawings.

Embodiment 1

Figure 1:
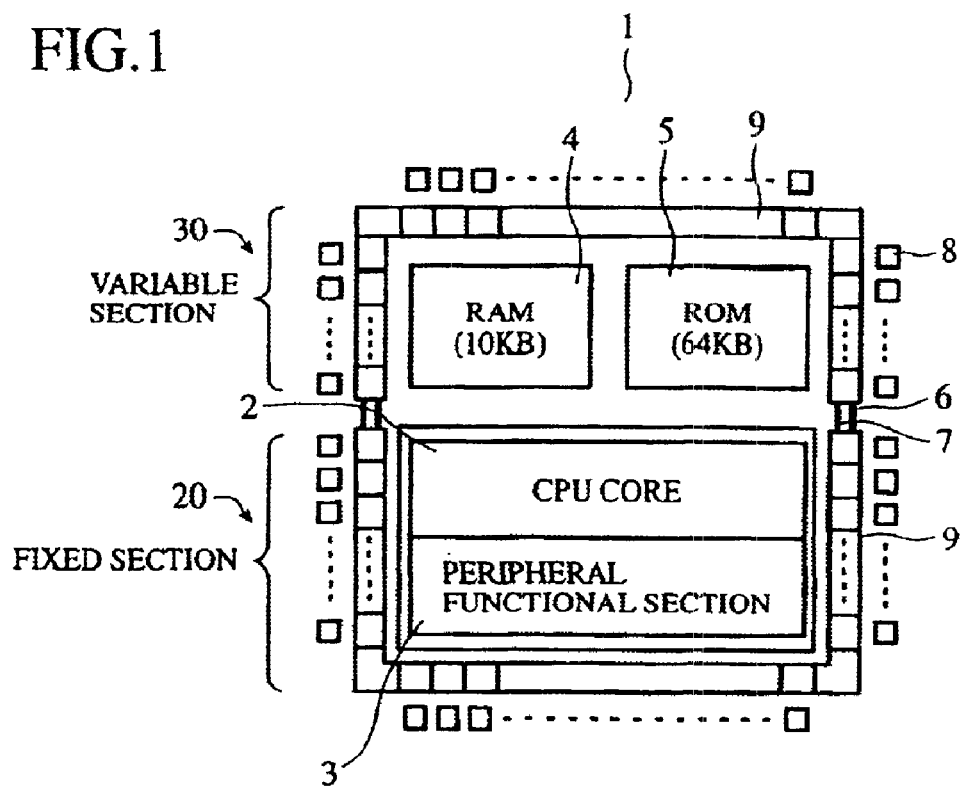
FIG. 1 is a schematic diagram showing a configuration of an embodiment 1 of the semiconductor integrated circuit in accordance with the present invention.

FIG. 1 is a schematic diagram showing a configuration of an embodiment 1 of the semiconductor integrated circuit in accordance with the present invention. The semiconductor integrated circuit 1 of the present embodiment 1 is roughly composed of a fixed section 20 including a CPU core 2 and peripheral functional section 3, and a variable section 30 including a RAM 4 and ROM 5. In addition, around the perimeter of the internal circuit, power supply wiring 6 and ground wiring 7 are provided for supplying power supply potential and ground potential, respectively. Furthermore, around their perimeter, pads 8 are disposed as terminals for electrically connecting the internal circuit to the outside, and a pad protection circuits 9 is disposed for protecting the internal circuit from overcurrent. The capacity of the RAM 4 and ROM 5 are 10 KB and 64 KB, for example.

The present invention aims to reduce the considerable manpower required for the characteristic verification and evaluation of the internal circuit after the layout modification, which will inevitably occur in the technique disclosed in the relevant reference 1.

More specifically, the variable section 30 consists of a region including the circuit components such as the RAM 4 and ROM 5 whose function and performance are intended to be modified in the semiconductor integrated circuit 1. On the other hand, the fixed section 20 consists of a region including the circuits whose signal transfer characteristics do not vary when they are considered as a closed circuit, in spite of the layout modification of the variable section 30. The configuration obviates the need for the verification and evaluation of the characteristics of the circuits in the fixed section 20 after the layout modification. Therefore it can reduce the manpower required for the characteristic verification and evaluation.

The circuit components to be disposed in the fixed section 20 include a processing circuit constituting the CPU core 2 and a storing circuit such as registers. The circuit components constituting the peripheral functional section 3 in the fixed section 20 include a bus interface for making the signal transfer between the internal bus and individual circuit components, an interrupt controller for carrying out the interrupt control of instructions the CPU core 2 executes, a timer, and an I/O interface of a serial signal.

These circuit components can constitute a circuit whose signal transfer characteristics do not vary when the circuit is considered as a closed circuit, in spite of the modification of the circuit components disposed in the variable section 30. Therefore carrying out the timing verification and evaluation in advance of the signal transfer of the circuits disposed in the fixed section 20 makes it possible to know the timing characteristics, which can eliminate the need for the timing verification of the fixed section 20 at the layout modification.

The variable section 30 includes circuit components whose function and performance are intended to be modified. For example, when the semiconductor integrated circuit 1 is composed of a one-chip general-purpose microcomputer with the built-in RAM 4 and ROM 5, modifying the storing capacity of the RAM 4 and ROM 5 enables the development of a series of products. Thus, the circuit components such as the RAM 4 and ROM 5 are disposed in the variable section 30.

Figure 2A:
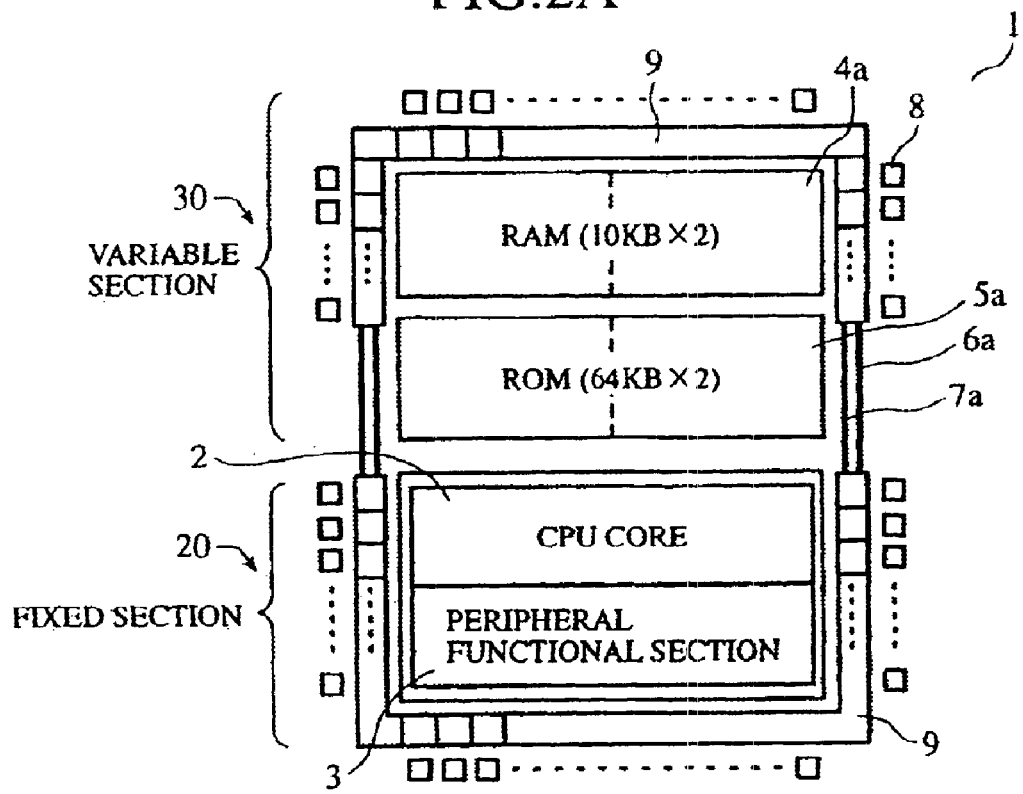
FIGS. 2A and 2B are schematic diagrams each showing a result of a layout modification involved in a change of the RAM and ROM of the semiconductor integrated circuit of FIG. 1.
Figure 2B:
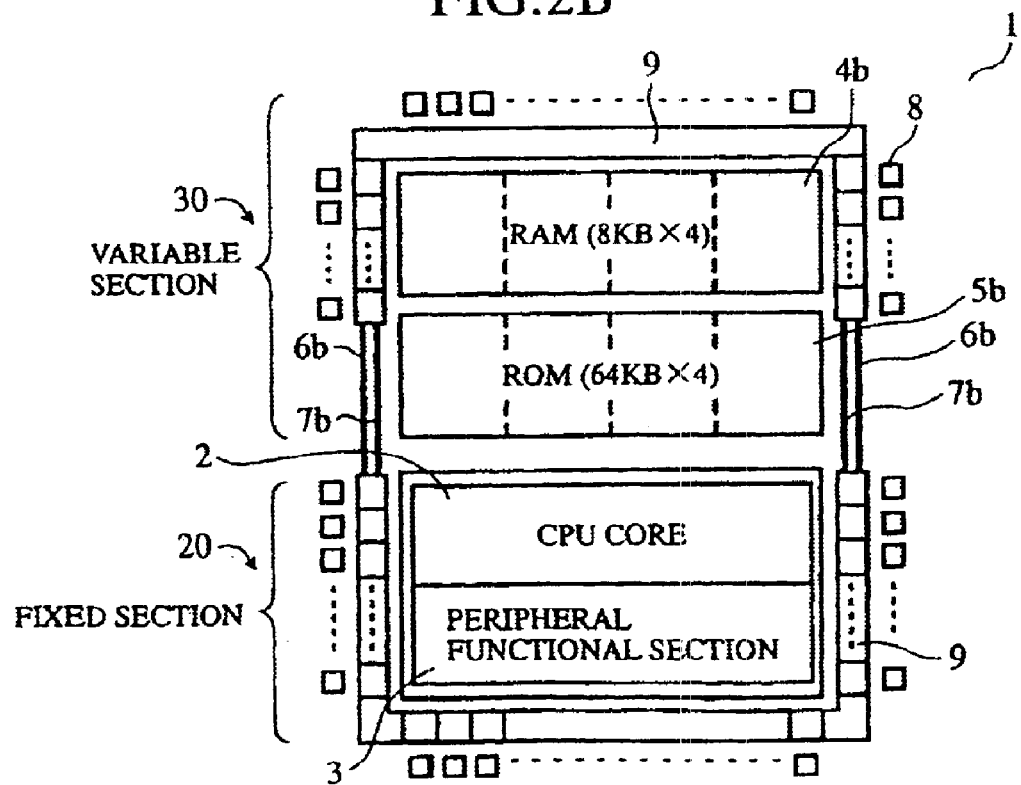

FIGS. 2A and 2B are schematic diagrams each showing a result in the layout modification involved in the modification of the RAM and ROM of the semiconductor integrated circuit of FIG. 1: FIG. 2A, shows a case where the RAM 4 and ROM 5 are replaced by a RAM 4a and ROM 5a with storing capacities twice those of the RAM 4 and ROM 5; and FIG. 2B shows a case where the RAM 4 and ROM 5 are replaced by a RAM 4b and ROM 5b with storing capacities of 32 KB and 256 KB. As shown in FIGS. 2A and 2B, no layout modification is made for the fixed section 20.

More specifically, the layouts of FIGS. 2A and 2B differ from the layout of FIG. 1 in that only the variable section 30 is extended in the vertical direction (toward the top of the sheet). In connection with this, the pads 8 and pad protection circuit 9 are shifted together in the vertical direction and are placed with keeping their relative positions. In addition, as for the power supply wiring 6 and ground wiring 7, their layouts are extended in the vertical direction, constituting power supply wiring 6a and ground wiring 7a in FIG. 2A and power supply wiring 6b and ground wiring 7b in FIG. 2B.

As to the semiconductor integrated circuit 1 after the layout modification, the timing verification of the operation of the RAM 4a and ROM 5a or RAM 4b and ROM 5b is carried out. In addition, as for the electrical connections between the pads 8 disposed on the variable section 30 side and the circuit components on the fixed section 20 side, the timing verification of the signal transfer through the electrical connections is carried out.

As described above, the present embodiment 1 assigns to the variable section 30 the circuit components such as the RAM 4 and ROM 5 whose function and performance are intended to be modified in the semiconductor integrated circuit (to develop a series of products), and assigns to the fixed section 20 the circuit composed of the CPU core 2 and peripheral functional section 3 whose signal transfer characteristics are known when they are considered as a closed circuit; and carries out the layout modification involved in the expansion of the RAM 4 and ROM 5 only for the variable section 30. Thus, the present embodiment 1 can circumvent not only the layout design and layout verification of the fixed section 20, but also the timing verification of the signal transfer of the circuits disposed in the fixed section 20. Accordingly, the present embodiment 1 can reduce the manpower required for the layout modification and characteristic verification and evaluation of the circuits involved in the modification. Furthermore, it can obviate the need for the characteristic evaluation of the fixed section 20 in the characteristic evaluation of the entire chip after manufacturing.

The foregoing embodiment 1 is described byway of an example in which the CPU core 2 and peripheral functional section 3 are disposed in the fixed section 20 collectively without considering the area and the shape of the fixed section 20. However, it is also possible to firstly determine the area and the shape of the chip after the layout modification involved in the change of the circuit components in the variable section 30, and then to determine the area and the shape of the fixed section 20 in accordance with the area and the shape of the variable section 30 after the layout modification.

For example, as for the one-chip general-purpose microcomputer including the RAM 4 and ROM 5 in the variable section 30, the fixed section 20 with the same area is assigned to the combination of the RAM 4 and ROM 5 with the storing capacities of 31 KB and 384 KB, respectively, and to the combination of the RAM 4 and ROM 5 with the storing capacities of 31 KB and 512 KB, respectively, whose combinations allow the same area and the shape for the fixed section 20. As for the combination of the RAM 4 and ROM 5 with the storing capacities of 10 KB and 128 KB and the combination of the RAM 4 and ROM with the storing capacities of 4 KB and 64 KB, whose combinations allow the same area and the shape on the chip for the fixed section 20.

Figure 3:
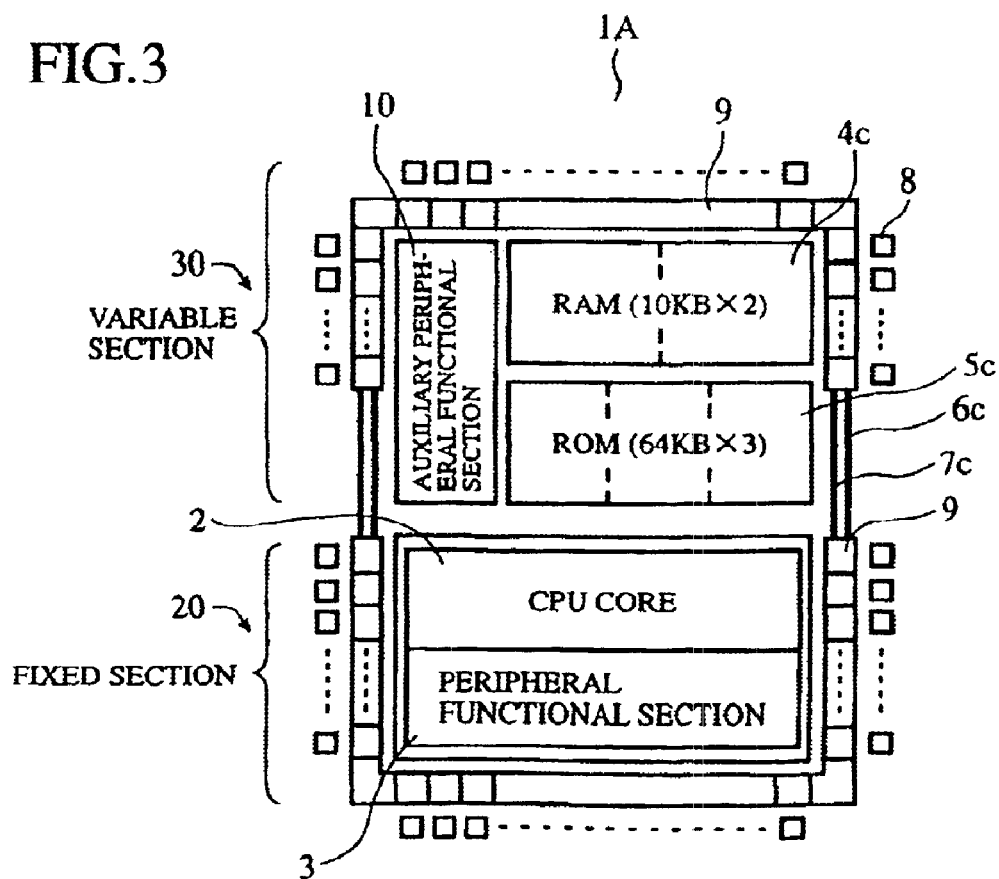
FIG. 3 is a schematic diagram showing a result of adding an auxiliary peripheral functional section to the semiconductor integrated circuit of FIG. 1 in conjunction with the modification of the RAM and ROM.

FIG. 3 is a schematic diagram showing a result of adding an auxiliary peripheral functional section to the semiconductor integrated circuit of FIG. 1 along with the modification of the RAM and ROM. In the semiconductor integrated circuit 1A of FIG. 3, the RAM 4 and ROM 5 in FIG. 1 are replaced by a RAM 4c and ROM 5c with the storing capacities of 20 KB and 192 KB. As in the examples shown in FIGS. 2A and 2B, only the variable section 30 of the semiconductor integrated circuit A is modified by extending the layout in the vertical direction. The power supply wiring 6 and ground wiring 7 are also extended in the vertical direction to constitute power supply wiring 6c and ground wiring 7c.

In the example of FIG. 3, an auxiliary peripheral functional section (newly added circuit component) 10 is disposed in an available region in the variable section 30 after the layout modification. As the auxiliary peripheral functional section 10, there is a CAN circuit (mainly used for automotive application) having a communication function by using CAN (Controller Area Network) protocol. In the semiconductor integrated circuit in accordance with the present invention, the circuit that provides an additional function is to be disposed in the variable section 30. The configuration enables the layout design, layout verification and the timing verification of the signal transfer to be carried out only for the variable section 30 including the auxiliary peripheral functional section 10. Thus, it can reduce the manpower required for the layout modification and the characteristic verification and evaluation of the circuit involved in the layout modification.

Embodiment 2

Figure 4:
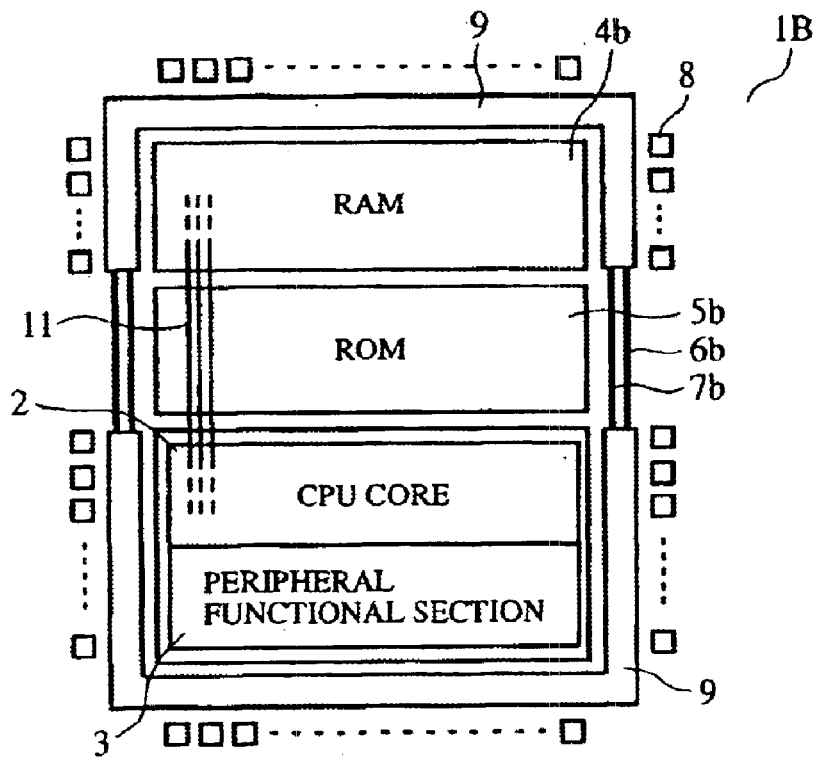
FIG. 4 is a schematic diagram showing a configuration of an embodiment 2 of the semiconductor integrated circuit in accordance with the present invention.

FIG. 4 is a schematic diagram showing a configuration of an embodiment 2 of the semiconductor integrated circuit in accordance with the present invention, in which the layout of the semiconductor integrated circuit of FIG. 1 is modified to that of FIG. 2B. In FIG. 4, the same reference numerals as those of FIG. 2B designate the same or like portions, and the description thereof is omitted here. As shown in FIG. 4, the present embodiment 2 is configured such that wiring is provided for electrically connecting the RAM 4b and pads 8 disposed on the variable section 30 after the layout modification to the CPU core 2 and peripheral functional section 3 in the fixed section 20 in such a manner that the wiring vertically passes across the ROM 5b near the center of the chip of the semiconductor integrated circuit 1B.

More specifically, the memory cells in the ROM 5b are laid out using a master layer such as a diffusion pattern or polysilicon pattern, and first and second layer aluminum wiring, for example. In this case, third aluminum wiring is further formed on the foregoing layers so that the RAM 4b and pads 8 disposed on the variable section 30 are electrically connected to the CPU core 2 and peripheral functional section 3 in the fixed section 20.

In this way, the electrical connection between these circuit components can be achieved through shortest wiring by placing the third layer aluminum wiring for electrically connecting the circuit components disposed on the variable region to the circuit components in the fixed region along a straight path interconnecting these circuit components. Consequently, the present embodiment 2 can circumvent or simplify the timing verification of the signal transfer through the wiring.

Embodiment 3

Figure 5:
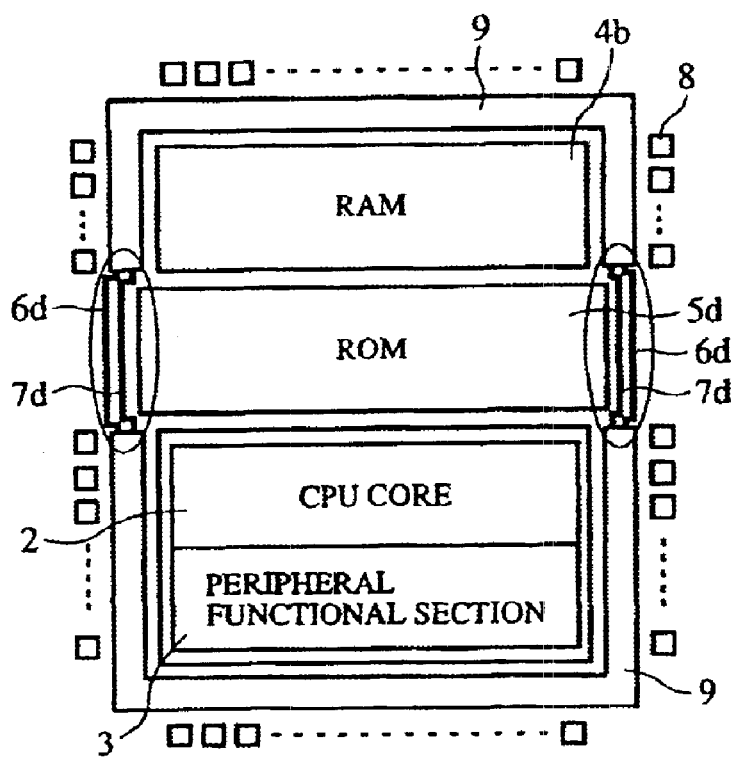
FIG. 5 is a schematic diagram showing a configuration of an embodiment 3 of the semiconductor integrated circuit in accordance with the present invention.

FIG. 5 is a schematic diagram showing a configuration of an embodiment 3 of the semiconductor integrated circuit in accordance with the present invention. In FIG. 5, the same reference numerals as those of FIG. 2B designate the same or like portions, and the description thereof is omitted here. The example of FIG. 5 is the same as the configuration of FIG. 2B in that it is obtained by making a layout modification of the foregoing embodiment 1 of the semiconductor integrated circuit 1 of FIG. 1, but differs in that it is designed such that its layout makes effective use of the space between the variable section 30 and fixed section 20 resulting from the layout modification.

When only the variable section 30 is extended in the Vertical direction (toward the top of the sheet) as in the foregoing embodiment 1 in the layout modification, the pads 8 and pad protection circuits 9 are shifted together in the vertical direction and are placed with maintaining their relative positions. In addition, the power supply wiring 6 and ground wiring 7 are also extended in the vertical direction. In this case, the pads 8 and pad protection circuit 9 shift away from the portions enclosed by thin ellipses in FIG. 5.

In other words, the portions constitute idle spaces in the chip area by an amount of lacking the pads 8 and pad protection circuit 9. Considering this, the present embodiment 3 relocates the circuit component near the idle spaces in the variable section 30 to an enlarged region including the idle spaces. In the example of FIG. 5, the power supply wiring 6d and ground wiring 7d are bent toward the outside of the chip so that the ROM 5d is placed within the expanded region.

Thus, the present embodiment 3 can make effective use of the layout space between the variable section. 30 and fixed section 20 resulting from the layout modification.

Figure 6:
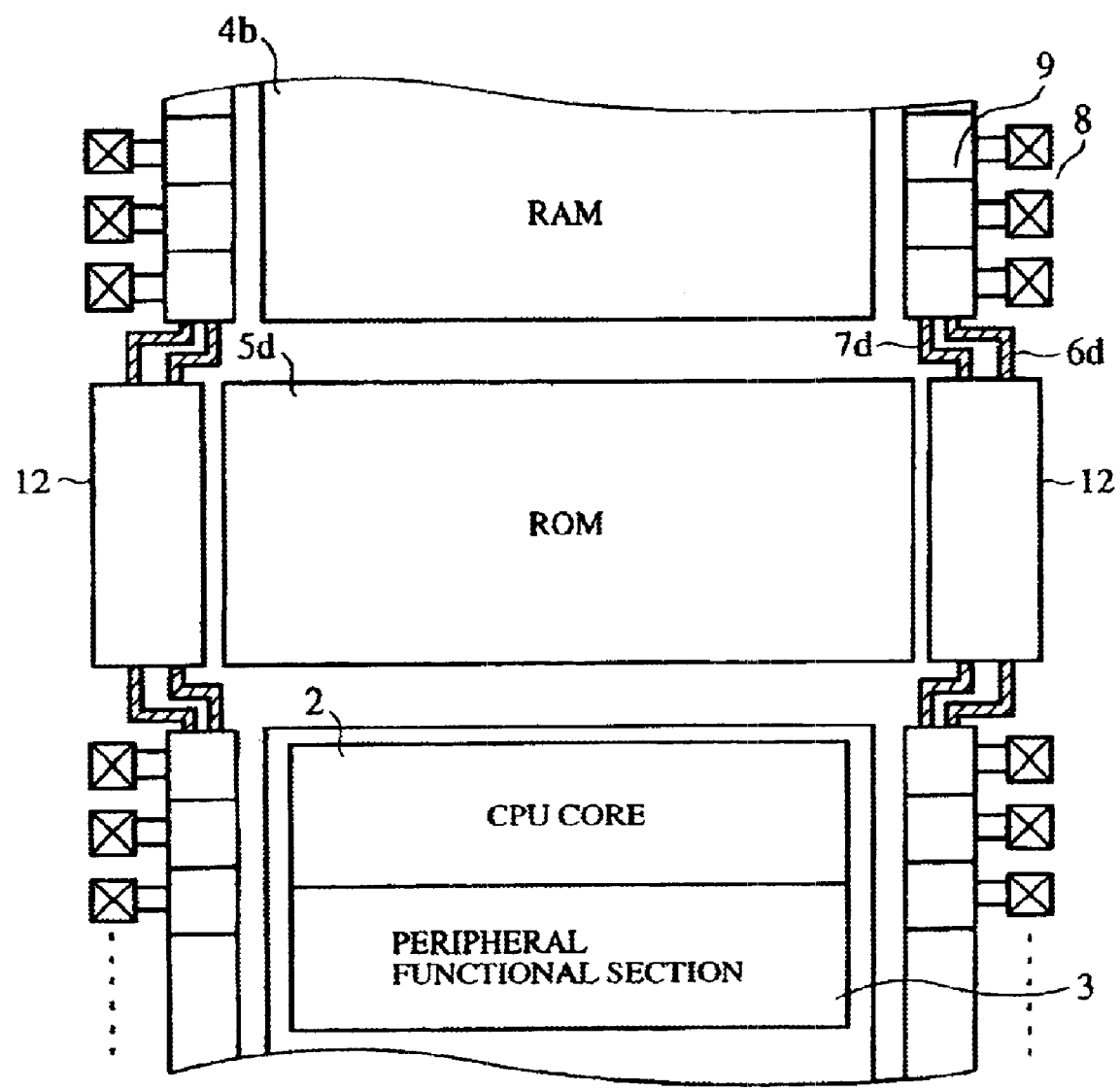
FIG. 6 is a plan view showing an example having power supply wiring and ground wiring provided with anti-noise bypass capacitors.

In addition, bypass capacitors 12 as shown in FIG. 6 can be provided to the power supply wiring 6d and ground wiring 7d between the variable section 30 and fixed section 20 after the layout modification. This makes it possible to prevent noise generation in the power supply wiring 6d and ground wiring 7d.

Figure 7:
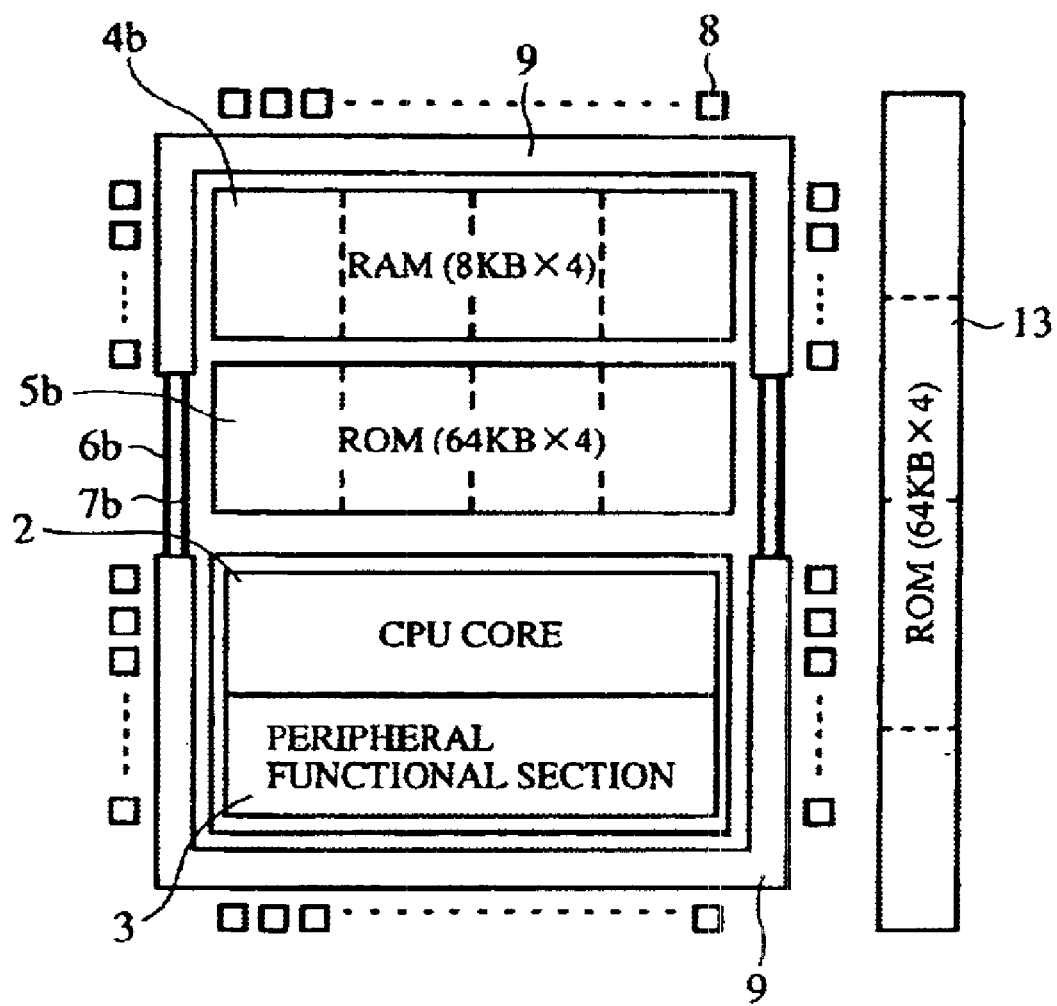
FIG. 7 is a plan view showing an example having an extended memory disposed outside pads.

When the RAM and ROM, which are placed in the variable section 30 in the foregoing embodiments, have not enough storing capacities, they can be replaced by a RAM and ROM with greater storing capacities. In this case, the shape of the chip after the layout modification may become too flat. In such a case, an extended memory (newly added circuit component) 13 can be placed outside the pads 8 on the perimeter of the chip as shown in FIG. 7 instead of placing it within the variable section 30. Likewise, when the auxiliary peripheral functional section cannot be placed within the variable section 30, it can be placed outside the pads 8 on the perimeter of the chip as a newly added circuit component.

In this case, it is enough for the layout design, layout verification, timing verification and characteristic evaluation after manufacturing the chip to be carried out only for the circuit within the variable section 30 and the circuit placed outside the pads 8 surrounding the chip after the layout modification involved in the change of the circuit components in the variable section 30. Thus placing the auxiliary peripheral functional section outside the pads 8 oh the perimeter of the chip enables the addition of a new function or modification of performance with preventing the chip shape after the layout modification from becoming too flat.

What is claimed is:

1. A semiconductor integrated circuit comprising:
   a variable region to be subjected to a layout modification in conjunction with a change of a circuit component within the variable region; and
   a fixed region that is free from the layout modification in conjunction with the change of the circuit component within the variable region, and that includes circuits whose signal transfer characteristics are known in advance, wherein timing verification and evaluation of characteristics are carried out only on the variable region after layout modification.

2. The semiconductor integrated circuit according to claim 1, further comprising a newly added circuit component placed within the variable region.

3. The semiconductor integrated circuit according to claim 1, further comprising wiring for electrically connecting the circuit component in the variable region with the circuit component in the fixed region, said wiring being disposed along a straight path connecting the circuit components.

4. The semiconductor integrated circuit according to claim 1, wherein when the layout modification leaves in the variable region an idle space in which no circuit component is present, the circuit component in the variable region is placed such that it fills the variable region extended by an amount of the idle space.

5. The semiconductor integrated circuit according to claim 1, further comprising an anti-noise bypass capacitor provided to wiring between the variable region and fixed region.

6. The semiconductor integrated circuit according to claim 1, further comprising a newly added circuit component separately placed from the variable region and fixed region.

* * * * *